(12) United States Patent
Lingambudi et al.

(10) Patent No.: US 7,921,404 B2
(45) Date of Patent: Apr. 5, 2011

(54) METHOD OF REUSING CONSTRAINTS IN PCB DESIGNS

(75) Inventors: Anil Bindu Lingambudi, Karnataka (IN); Ankur Kanu Patel, Rochester, MN (US); Saravanan Sethuraman, Bangalore (IN); Diyanesh Vidyapoornachary Babu Chinnakkonda, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 655 days.

(21) Appl. No.: 11/954,092

(22) Filed: Dec. 11, 2007

(65) Prior Publication Data

US 2009/0150834 A1 Jun. 11, 2009

(51) Int. Cl.
*G06F 17/50* (2006.01)
(52) U.S. Cl. ........................................ 716/139; 716/137
(58) Field of Classification Search .................. None
See application file for complete search history.

(56) References Cited

U.S. PATENT DOCUMENTS

| | | | |
|---|---|---|---|
| 6,216,109 B1* | 4/2001 | Zweben et al. | 705/8 |
| 6,629,294 B2* | 9/2003 | Van Stralen | 716/4 |
| 7,243,314 B2* | 7/2007 | Ting | 716/2 |
| 7,418,683 B1* | 8/2008 | Sonnard et al. | 716/5 |
| 7,546,571 B2* | 6/2009 | Mankin et al. | 716/15 |
| 2002/0067364 A1* | 6/2002 | Lane et al. | 345/531 |
| 2006/0259891 A1* | 11/2006 | Ting | 716/11 |

OTHER PUBLICATIONS

Musetti et al., "CaptureCIS—Allegro Design reuse flow with electrical constraints for productivity improvements," CDNLive, Sep. 12-14, 2005, 33 pages.*
White Paper "Return of Investment—A Co-Design Methodology for System Interconnect", Cadence Design Systems Inc., San Jose, CA 95134, 2004. www.cadence.com/whitepapters/allegro_roi_wp.pdf, 9 pages.

(Continued)

*Primary Examiner* — Leigh Marie Garbowski
(74) *Attorney, Agent, or Firm* — Sprusons and Ferguson; Roy W. Truelson

(57) ABSTRACT

A method is disclosed for electronically processing constraints rules defined in a previously developed first PCB design having a first constraints output file, to facilitate the development of a second PCB design having a second constraints output file. The second design has substantially identical topology to the first design and the second constraints output file comprises constraints for signals with identical attributes. The method includes several steps. Firstly, the board file of the first design is compared with the net list file of the second design to identify respective differences between the designs. On the basis of the established differences, a file attributes change report is generated. At least some data from the file attributes change report is stored into an attributes change file. Finally, the method includes the step of processing the first design constraints output file, the second design constraints output file, and the attribute change file to map constraints associated with changed attributes, thus defining a revised constraints output file for the second design. The revised second constraints output file comprises constraints for at least some signals with changed attributes.

5 Claims, 3 Drawing Sheets

OTHER PUBLICATIONS

"Intergrating PCB and FPGA Constraints", Bruce Riggens, Mentor Graphics Corporation, Aug. 22, 2006. www.fpgajournal.com/articles_2006/20060822, 5 pages.

"Signal Integrity Interconnect Analysis & Design Constraints System", Member of Cadence, Innoveda, Protel & Zuken Partners Programs. www.precience.com/pdf/SI-Planner.pdf, 2 pages. "Capitalizing on Constraints", Bruce Caryl and John Duke, Mentor Graphics, Jun. 1, 2006. http://pcdandf.com/cms/content/view/2629/95/.

"Allegro Design Entry HDL SI 610: Constraint Development Through Simulation During Schematic Design", 2005 Cadence Design Systems, Inc. http://www.cadence.com/datasheets/allegro_pcb_si610_ds.pdf, 4 pages.

"Constraint Manager in Cadence PCB Design Flow", Jun. 9, 2006-Jun. 13, 2006. http://www.cadence.com/webinars/webinars_pf.aspx?xml=constraint_manager, 1 page.

"Constraint Reuse in PCB Hardware Design using a Hierarchical Approach", Nov. 16, 2005. http://www.cadence.com/webinars/webinars_pf.aspx?xml=constraint_reuse, 1 page.

"ICX Pro Explorer SI Analysis", Mentor Graphics. http://www.mentor.com/training_and_services/training/courses/pcb_systems/226818.cfm, 3 pages.

"USB Subsystem IP", Mentor Graphics. http://www.mentor.com/products/ip/subsystem_ip/index.cfm, 2 pages.

"Constrained-Random Test Generation and Functional Coverage with Vera®", Feb. 2003. Vera Testbech Automation. Last mod. Jan. 16, 2004. http://www.synopsys.com/products/vera/vera60_wp.html, 7 pages.

"EMC/SI; Cadstar SI Verify", Zuken Ltd. 2006. http://www.cadstarworld.com/products_si-verify.asp, 3 pages.

* cited by examiner

METHOD OF REUSING CONSTRAINTS IN PCB DESIGNS

TECHNICAL FIELD

The present invention relates to reuse of constraints files during development of new PCB designs, and in particular to the reuse of constraints between PCB designs with substantially identical logic.

BACKGROUND OF THE INVENTION

In recent years, designing printed circuit boards (PCBs) has become increasingly complex. Operating frequencies have increased, rise-time of signals has shortened, board sizes have become increasingly compact and interfaces have become increasingly critical. Typically, High Speed PCB design requires good routing practices to reduce the effect of signal integrity parameters such as reflection, crosstalk, simultaneous switching noise (SSN) and electromagnetic interference (EMI). These parameters, which decrease the efficiency of device employing such PCBs over a period of time, are minimised by imposing particular constraints on the respective PCB design.

Signal Integrity Engineers often use tools to force routing rules/constraints on critical signals of some high-speed interfaces. The tool ensures that transmitted signal do not violate design rules required for optimum functioning of the PCB. Using the constraints tool to, based on an existing design file (Rev 0), create a new design file (Rev 1) is often associated with a change in attributes attached to the original file, such as net names, reference designators (refdes) and extended electrical nets. The constraints of signals with altered net-names or the refdes are redefined manually for the new design.

For example, a typical processor—SDRAM interface includes around 32 data signals, 8 data strobe & 8 mask signals, 12-14 address lines, clocks & control signals, making it a total of around 70 signals. When there is a change in net-names of these signals, for example, the data signals are changed from sdram_data0 to sdram data_0, the Address signals are changed from sdram_addr0 to sdram_addr_0 etc. Thus, if a new design is created, there would be a new netlist imported into the design. Even if there is no change in the net-logic or the topology, previously assigned constraints are removed and the constraints for the entire interface are deleted. The buses & constraints for each of the signals have to be re-created. This is a time consuming process, which substantially reduces the efficiency of the design process.

SUMMARY OF THE INVENTION

According to one aspect of the invention, there is provided a method for electronically processing constraints rules defined in a previously developed first PCB design comprising a first constraints output file, to facilitate the development of a second PCB design comprising a second constraints output file, the second design substantially identical topology to the first design, the second constraints output file comprising constraints for signals with identical attributes, the method comprising:
  Comparing a boards file of the first design with a net list file of the second design to identify respective differences between the first design and the second design, and;
  on determination of differences:
    generating a file attributes change report;
    storing data from the file attributes change report into an attributes change file; and
    processing the first design constraints output file, the second design constraints output file, and the attribute change file to map constraints associated with changed attributes, thus defining a revised constraints output file for the second design, the revised second constraints output file comprising constraints for at least some signals with changed attributes.

According to a second aspect of the invention, there is provided an electronic system for electronically processing constraints rules defined in a previously developed first PCB design comprising a first constraints output file, to facilitate the development of a second PCB design comprising a second constraints output file, the second design substantially identical topology to the first design, the second constraints output file comprising constraints for signals with identical attributes, the system comprising;
  computational means for comparing a boards file of the first design with a net list file of the second design to identify respective differences between the first design and the second design, and;
  computational and memory means for, on determination of differences;
    generating a file attributes change report;
    storing data from the file attributes change report into an attributes change file; and
    processing the first design constraints output file, the second design constraints output file, and the attribute change file to map constraints associated with changed attributes, thus defining a revised constraints output file for the second design, the revised second constraints output file comprising constraints for at least some signals with changed attributes.

According to a third aspect of the invention, there is provided a computer program product comprising a computer-readable medium having an executable code recorded therein, the code being arranged to, upon execution, electronically process constraints rules defined in a previously developed first PCB design comprising a first constraints output file, to facilitate the development of a second PCB design comprising a second constraints output file, the second design substantially identical topology to the first design, the second constraints output file comprising constraints for signals with identical attributes, the executable code comprising;
  a section for comparing a boards file of the first design with a net list file of the second design to identify respective differences between the first design and the second design, and;
  a section for, on determination of differences:
    generating a file attributes change report;
    storing data from the file attributes change report into an attributes change file; and
    processing the first design constraints output file, the second design constraints output file, and the attribute change file to map constraints associated with changed attributes, thus defining a revised constraints output file for the second design, the revised second constraints output file comprising constraints for at least some signals with changed attributes.

DETAILED DESCRIPTION

Figure 1:
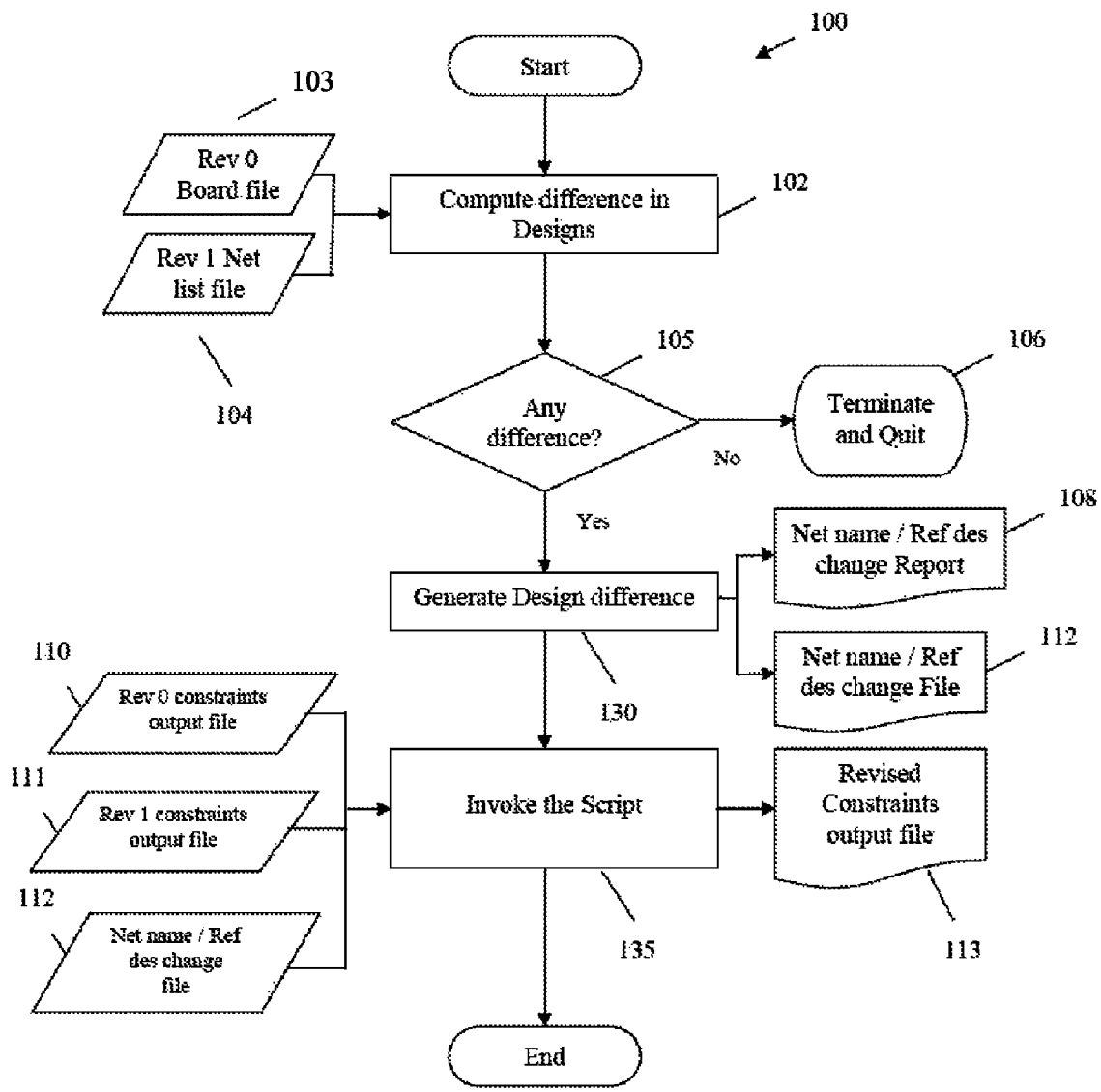
FIG. 1 is a schematic flow diagram of the method for constraints reuse embodying the invention.

Disclosed is a method 100 for reusing the PCB design constraints for signals with altered net-names and/or refdes, is illustrated in FIG. 1. The method 100 starts with step 102, during which the difference between the previous design and the newly developed design is identified by comparing the Rev 0 board file 103 with the Rev 1 net-list file 104. In step 105 a check is made to determine if there are any differences between the Rev 0 board file and Rev 1 net-list files. If there are no differences determined, the method terminates in step 106. If there are differences determined in step 105, a design difference file is established including any amended attributes such as netnames and/or refdes in step 130. A netnames/refdes difference report 108 is established for the design difference file and at least some of the associated data is stored in a netnames/refdes change file 112. The constraints output files 110 and 111 for board files Rev 0 and Rev 1 are also obtained. A constraints mapping script is then invoked in step 135, which process the Rev 0 constraints output file 110, the Rev 1 constraints output file 111 and the net-name/refdes change file 112, to generate a revised constraints output file 113. As a result, constraints for signals with amended attributes, such as net-names and refdes, will be copied to the new board file Rev 1. If a topology conflict between constraints is detected, the user is notified.

In a preferred embodiment, the implementation of method 100 is by way of a GUI script which is triggered by the user, for example by way of an icon, not shown, called "Constraints Mapper". The icon is preferably located on an existing constraint edit tool bar, and it should be apparent to one skilled in the art that such icons may be located at a suitable location chosen by the user or by the provider of the tool. The various functionalities performed by the method 100 are effected by scripts running/executing as background jobs of the main application.

Figure 2:
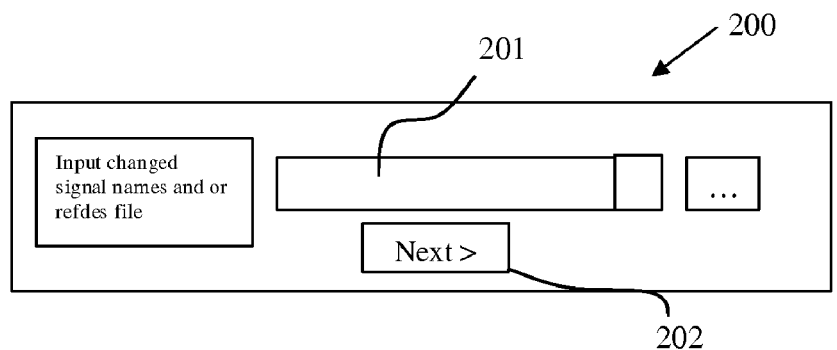
FIG. 2 shows a display screen including a pop-up window for selecting input files, the window being generated by an executable code implementing a method embodying the described method for constraints reuse.
Figure 3:
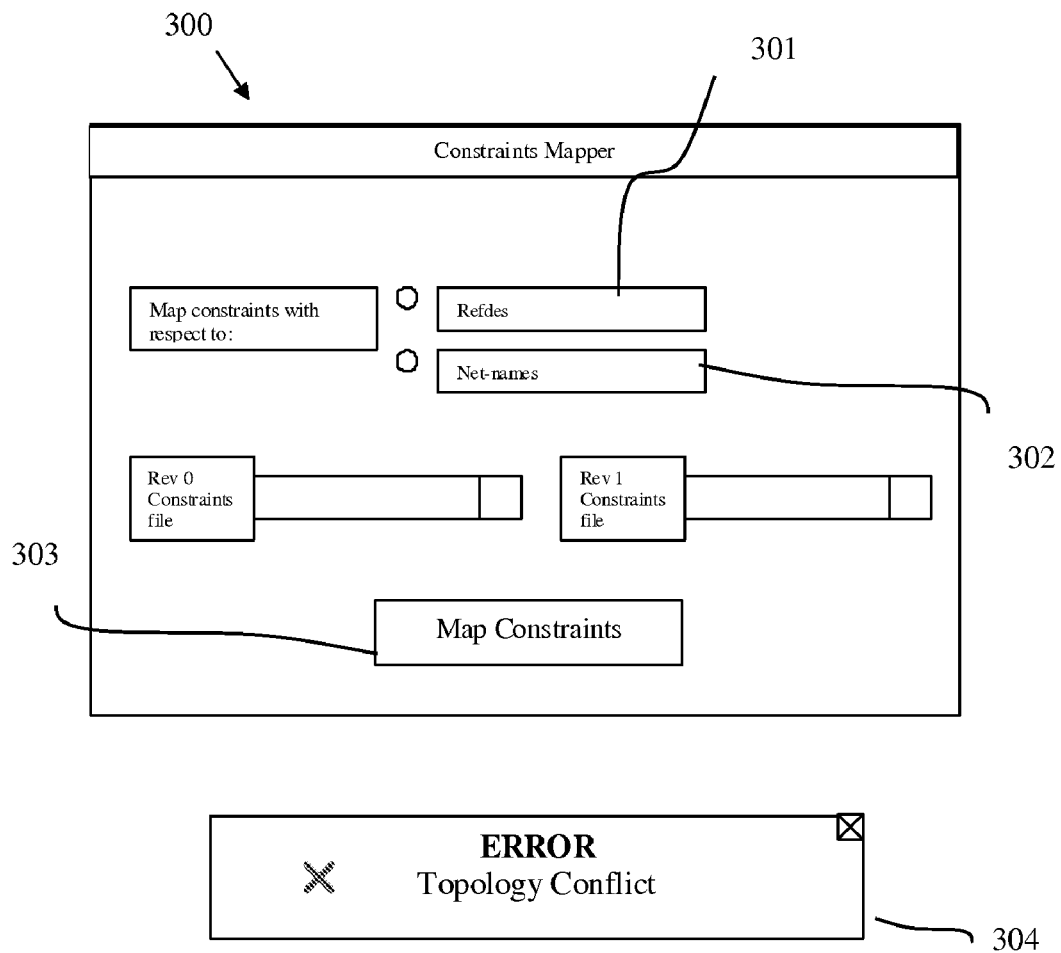
FIG. 3 shows a display screen including constraints mapper pop-up window generated by the executable code implementing the described method for constraints reuse.

Input from the user in one embodiment may be obtained by way of pop-up windows, such as pop up windows 200 and 300 shown in FIGS. 2 and 3, respectively. In particular, pop-up window 200 in FIG. 2 requests from the user to identify the changed signal names and/or refdes files in field 201 which is configured to receive an input from the user. Entering data in field 201 is mandatory and the 'NEXT' button 202 is made available to the user only after the user selects the input file in the required format. Clicking on the button 202 brings up the selection pop-up window 300 illustrated in FIG. 3. The window 300 requests a selection to be made by the user between refdes and netnames by pressing button 301 or button 302, respectively. In addition, the user has to input the paths of files Rev 0 and Rev 1. The user then clicks on the "map constraints" button 303, which runs scripts, as described previously preferably as a background job, that copies the constraints associated with the amended netnames and/or refdes, to the new board file. As a result, the constraints file Rev 1 is updated. If there is any topology conflict, an error message 304 is presented to the user, as shown at the bottom of FIG. 3.

For example, if there is any change in signal name of a differential pair, the following properties have to be copied between the two design files; line width, spacing & coupling parameters, max uncoupled length & phase tolerance, via count & stub lengths, relative match delay groupings etc. If necessary, at least some of these parameters may have to be entered manually in the existing tools. Using the above disclosed method, constraints could be easily copied to the new board file for differential pairs as well.

Computer Platform

Figure 4:
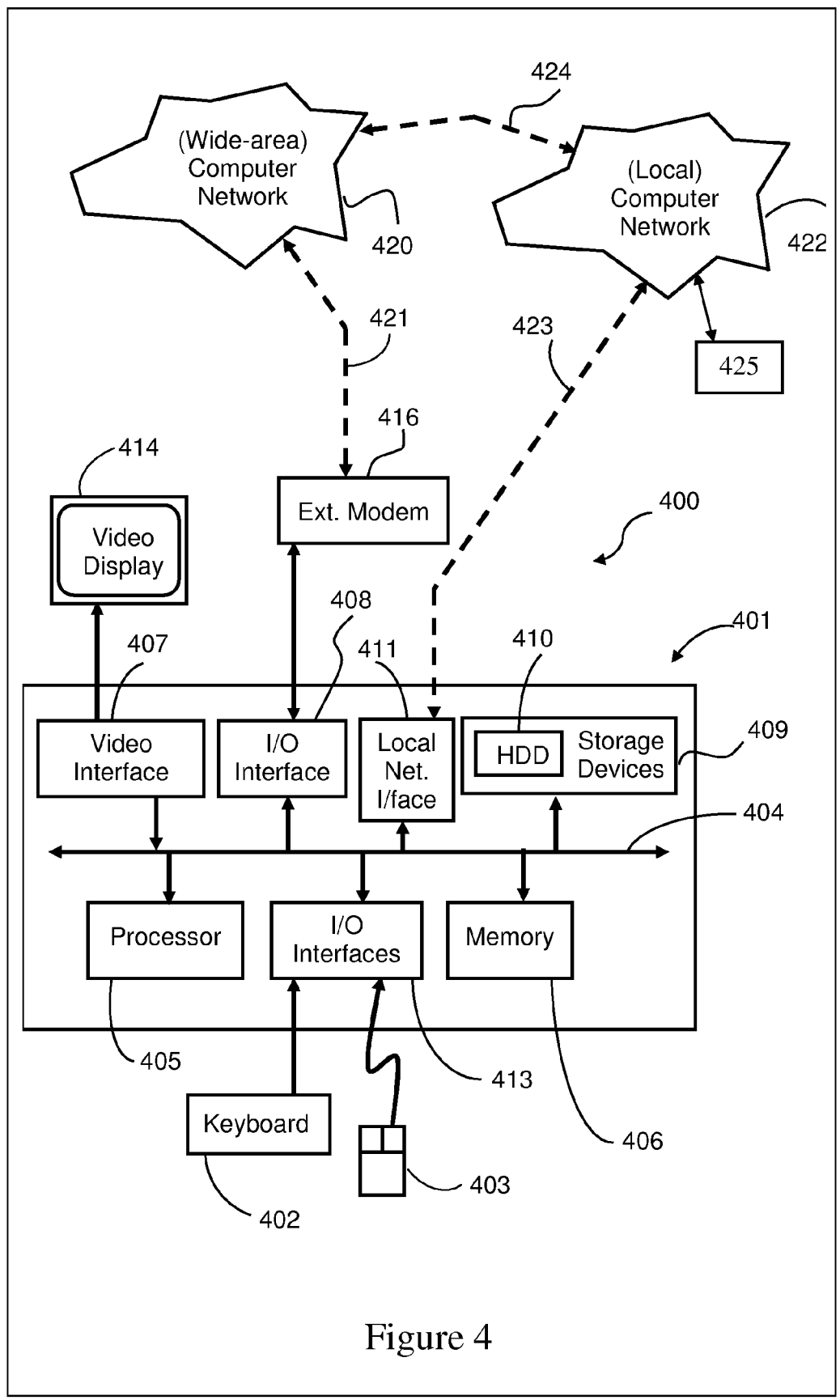
FIG. 4 is a schematic diagram of an electronic system for implementing the disclosed method for constraints reuse.

FIG. 4 shows a schematic block diagram of a stand alone or networked electronic system 400, with which the method for PCB design constraints reuse, as described above with respect to FIGS. 1 to 3 may be implemented in the form of application programs executable within a general purpose computer system 401 or within a hand-held device 425. Any software implementing the described method may be stored in a computer readable medium including storage devices. In the case illustrated in FIG. 4, the software is loaded into the computer 401 from the computer readable medium 410 and then executed by the computer 401. A computer readable medium having such software or computer program recorded on it is a computer program product.

As seen in FIG. 4, the computer system 401 can include input devices such as a keyboard 402 and a mouse pointer device 403, and output device such as display device 414. In this configuration, the computer 401 can be connected to any other computer systems via a network as the discussed method may need to be implemented by multiple computer systems, communicating with each other or with a server over a network. An external Modulator-Demodulator (Modem) transceiver device 416 may be coupled to the computer 401 for communicating to and from a communications network 420 via a connection 421. The network 420 may be a wide-area network (WAN), such as the Internet, or a private LAN.

The computer 401 typically includes at least one processor unit 405, and a memory unit 406 for example formed from semiconductor random access memory (RAM) and read only memory (ROM). Here, the processor unit 405 is an example of a processing means which can also be realized with other forms of configuration performing similar functionality. The computer 401 also includes a number of input/output (I/O) interfaces including a video interface 407 that couples to the output 414, preferably a video display 414, an I/O interface 413 for such devices like the keyboard 402 and mouse 403, and an interface 408 for the external modem 416. In some implementations, the modem 416 may be incorporated within the computer 401, for example within the interface 408. The computer 401 may also have a local network interface 411 which, via a connection 423, permits coupling of the computer system 400 to a local computer network 422, known as a Local Area Network (LAN). As also illustrated, the local network 422 may also couple to the wide network 420 via a connection 424, which would typically include a so-called "firewall" device or similar functionality. The interface 411 may be formed by an Ethernet™ circuit card, a wireless Bluetooth™, an IEEE 802.11 wireless arrangement or a combination of thereof.

Storage devices 409 are provided and typically include a hard disk drive (HDD) 410. It should be apparent to a person skilled in the art that other devices such as a floppy disk drive, an optical disk drive and a magnetic tape drive (not illustrated) may also be used. The components 405 to 413 of the computer 401 typically communicate via an interconnected bus 404 and in a manner which results in a conventional mode of operation of the computer system 400.

Typically, the programming modules that incorporate the discussed method are resident on the storage device 409 and read and controlled in execution by the processor 405. Storage of intermediate product from the execution of such programs may be accomplished using a semiconductor memory 406, possibly in concert with the storage device 409. In some instances, the application programs may be supplied to the user encoded on one or more CD-ROM or other forms of computer readable media and read via the corresponding drive, or alternatively may be read by the user from the networks 420 or 422.

If the method needs to be implemented on the handheld device 425, it can either utilize its own storage and processing means, similar to these described in relation to computer 401, or make use of a wireless network connection to a computer system, such as 401, on which all watermark related processing can be carried out remotely.

The discussed method allows constraints of at least some signals with altered attributes to be mapped from a first design to a second design, when the board files of the two designs have identical topology and net logic. It should be appreciated by a person skilled in the art that such an optimized mapping of constraints will reduce the development cycle and the overall costs of the PCB design process.

We claim:

1. A computer-implemented method for processing constraints rules defined in a previously developed first PCB design comprising a first constraints output file, to facilitate the development of a second PCB design comprising a second constraints output file, the second design substantially identical topology to the first design, the second constraints output file comprising constraints for signals with identical attributes, the method comprising:
   using a computer system to compare a boards file of the first design with a net list file of the second design to identify respective differences between the first design and the second design, and;
   on determination of differences:
      using a computer system to generate a file attributes change report;
      storing data from the file attributes change report into an attributes change file; and
      using a computer system to process the first design constraints output file, the second design constraints output file, and the attribute change file to map constraints associated with changed attributes, to generate with the computer system a revised constraints output file for the second design, the revised second constraints output file comprising constraints for at least some signals with changed attributes.

2. The method of claim 1, wherein the file output attributes include the netname or refdes.

3. The method of claim 1, wherein using a computer system to process the first design constraints output file, the second design constraints output file, and the attribute change file to map constraints associated with changed attributes, to generate with the computer system a revised constraints output file for the second design, comprises invoking a constraints mapping script which is executed by the computer system.

4. An electronic system for electronically processing constraints rules defined in a previously developed first PCB design comprising a first constraints output file, to facilitate the development of a second PCB design comprising a second constraints output file, the second design substantially identical topology to the first design, the second constraints output file comprising constraints for signals with identical attributes, the system comprising;
   computational means for comparing a boards file of the first design with a net list file of the second design to identify respective differences between the first design and the second design, and;
   computational and memory means for, on determination of differences;
      generating a file attributes change report;
      storing data from the file attributes change report into an attributes change file; and
      processing the first design constraints output file, the second design constraints output file, and the attribute change file to map constraints associated with changed attributes, to generate with said computational and memory means a revised constraints output file for the second design, the revised second constraints output file comprising constraints for at least some signals with changed attributes.

5. A computer program product comprising a non-transient computer-readable medium having an executable code recorded therein, the code being arranged to, upon execution, electronically process constraints rules defined in a previously developed first PCB design comprising a first constraints output file, to facilitate the development of a second PCB design comprising a second constraints output file, the second design substantially identical topology to the first design, the second constraints output file comprising constraints for signals with identical attributes, the executable code comprising;
   a section for comparing a boards file of the first design with a net list file of the second design to identify respective differences between the first design and the second design, and;
   a section for, on determination of differences:
      generating a file attributes change report;
      storing data from the file attributes change report into an attributes change file; and
      processing the first design constraints output file, the second design constraints output file, and the attribute change file to map constraints associated with changed attributes, thus generating a revised constraints output file for the second design, the revised second constraints output file comprising constraints for at least some signals with changed attributes.

* * * * *